US008687369B2

(12) United States Patent
Stronks et al.

(10) Patent No.: US 8,687,369 B2
(45) Date of Patent: Apr. 1, 2014

(54) APPARATUS FOR CREATING RESISTIVE PATHWAYS

(71) Applicants: David A. Stronks, Sunnyvale, CA (US);
Ahmad Al-Dahle, San Jose, CA (US);
Wei H. Yao, Palo Alto, CA (US)

(72) Inventors: David A. Stronks, Sunnyvale, CA (US);
Ahmad Al-Dahle, San Jose, CA (US);
Wei H. Yao, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/629,542

(22) Filed: Sep. 27, 2012

(65) Prior Publication Data
US 2013/0215578 A1 Aug. 22, 2013

Related U.S. Application Data

(60) Provisional application No. 61/600,980, filed on Feb. 20, 2012.

(51) Int. Cl.
*H05K 7/20* (2006.01)

(52) U.S. Cl.
USPC ........... 361/717; 361/749; 360/323; 330/195; 333/33; 430/41

(58) Field of Classification Search
USPC ....... 361/717, 749; 360/323; 333/33; 430/41; 330/195
See application file for complete search history.

(56) References Cited

U.S. PATENT DOCUMENTS

| 3,024,151 | A | 3/1962 | Robinson |
| 4,604,160 | A | 8/1986 | Murakami et al. |
| 4,606,787 | A | 8/1986 | Pelligrino |
| 4,790,902 | A | 12/1988 | Wada et al. |
| 4,899,126 | A | 2/1990 | Yamada |
| 5,563,572 | A | 10/1996 | Hetzler |
| 6,580,035 | B1 | 6/2003 | Chung |
| 2001/0023779 | A1 | 9/2001 | Sugaya et al. |
| 2003/0154592 | A1 | 8/2003 | Felten |
| 2003/0219608 | A1 | 11/2003 | Ishizaka et al. |
| 2004/0078969 | A1 | 4/2004 | Kanzawa et al. |
| 2006/0098351 | A1* | 5/2006 | Iben .............................. 360/323 |
| 2008/0266048 | A1 | 10/2008 | Fricke et al. |
| 2008/0273278 | A1* | 11/2008 | Iben .............................. 360/323 |
| 2010/0090781 | A1 | 4/2010 | Yamamoto et al. |
| 2011/0204976 | A1* | 8/2011 | Masuda ........................ 330/195 |

FOREIGN PATENT DOCUMENTS

| EP | 1542519 | 6/2005 |
| GB | 792920 | 4/1958 |
| JP | 61054657 | 3/1986 |

(Continued)

OTHER PUBLICATIONS

"Advanced Packaging Technology for Leading Edge Microelectronics and Flexible Electronics", presentation at Cornell University, Ray Fillion, GE Global Research, Feb. 20, 2006.

(Continued)

*Primary Examiner* — Xiaoliang Chen
(74) *Attorney, Agent, or Firm* — Womble Carlyle Sandridge & Rice LLP

(57) ABSTRACT

An apparatus configured to create a resistive pathway for an electronic assembly is disclosed. In one embodiment, the pathway can be formed with a resistive film in conjunction with a conductive adhesive and a coverlay. In another embodiment, the resistive film, the conductive adhesive and the coverlay can be relatively transparent. In yet another embodiment, the resistive pathway can couple directly with traces on an electronic assembly saving space and easing assembly.

18 Claims, 8 Drawing Sheets

(56) References Cited

FOREIGN PATENT DOCUMENTS

| | | |
|---|---|---|
| JP | 01307291 | 12/1989 |
| JP | 9064514 | 3/1997 |
| WO | WO2004014114 | 2/2004 |
| WO | WO2006067280 | 6/2006 |

OTHER PUBLICATIONS

International Search Report in International Application No. PCT/FI2005/050466, mailed Mar. 21, 2006.
International Search Report and Written Opinion from PCT Application PCT/US2013/026228, dated Jun. 3, 2013.

* cited by examiner

Equivalent Circuit

APPARATUS FOR CREATING RESISTIVE PATHWAYS

BACKGROUND

1. Technical Field

The described embodiments relate generally to electronic circuit design and more particularly to an apparatus for creating resistive pathways in electronic circuit assemblies.

2. Related Art

Electronic circuit designs are often implemented on a substrate to ease assembly and mount electronic components used in the design. Substrates can range from simple substrates such as a fiberglass or FR-4 dedicated to mounting and supporting electronic components, to more complex substrates that can not only support electronic components, but can also provide functionality by acting as a keyboard or a display. Substrates often support a mixture of components, traces and connectors.

Electronic designs are driven to become smaller especially because of the revolution in mobile electronic devices such as laptops, personal digital assistants, media players, mobile phones and the like. Efforts to shrink a design can be limited, however, because of the physical size of electronic components. Resistor networks are a common-place element in electronic designs. Implementing resistor networks can be costly in terms of parts and product area especially when implementing resistor networks with discrete resistors. Furthermore, each discrete resistor can add a point of mechanical failure to the design, particularly where the resistor is attached (typically soldered) to the substrate.

Therefore, what is desired is a reliable way to simplify electronic circuit designs by reducing the impact of resistor networks.

SUMMARY

This paper describes various embodiments that relate to an apparatus and methods, for electrically coupling traces by a resistive film.

In a first embodiment a method for forming a resistive pathway across a plurality of electrical traces is disclosed. The method includes at least the following steps: (1) preassembling a resistor network, the resistor network including a layer of coverlay, a layer of conductive adhesive disposed on the layer of coverlay, and a number of resistive films adhesively coupled to the coverlay by the conductive adhesive layer, where the number of resistive films is configured to align with the number of electrical traces; and (2) electrically coupling at least two of the plurality of electrical traces together using the preassembled resistor network.

In another embodiment an electronic device is disclosed. The electrical device includes at least the following: (1) a printed circuit board; (2) a number of electrical traces disposed on the printed circuit board, a first end of each of the number of electrical traces coupled to a high impedance circuit; (3) a resistive film disposed across the plurality of electrical traces, the resistive film having an impedance substantially less than the high impedance circuit; (4) a layer of conductive adhesive; and (5) a layer of coverlay adhesively joined to the resistive film by the layer of conductive adhesive. A second end of the plurality of electrical traces are each electrically coupled to a low impedance circuit have a substantially lower impedance than the resistive film.

In yet another embodiment a method for forming a resistive pathway on an electronic assembly is disclosed. The electronic assembly includes at least a first and second substrate, the first substrate including a number of traces carrying signals. The method includes at least the following steps: (1) placing a resistive film onto the plurality of traces, where the resistive film couples the number of traces across the resistive film; (2) placing a conductive adhesive layer on the resistive film; and (3) applying the conductive adhesive to the second substrate. The resistive film electrically couples the number of traces in parallel such that built up charge on any of the plurality of traces is distributed across the number of traces.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF EXAMPLE EMBODIMENTS

Figure 1:
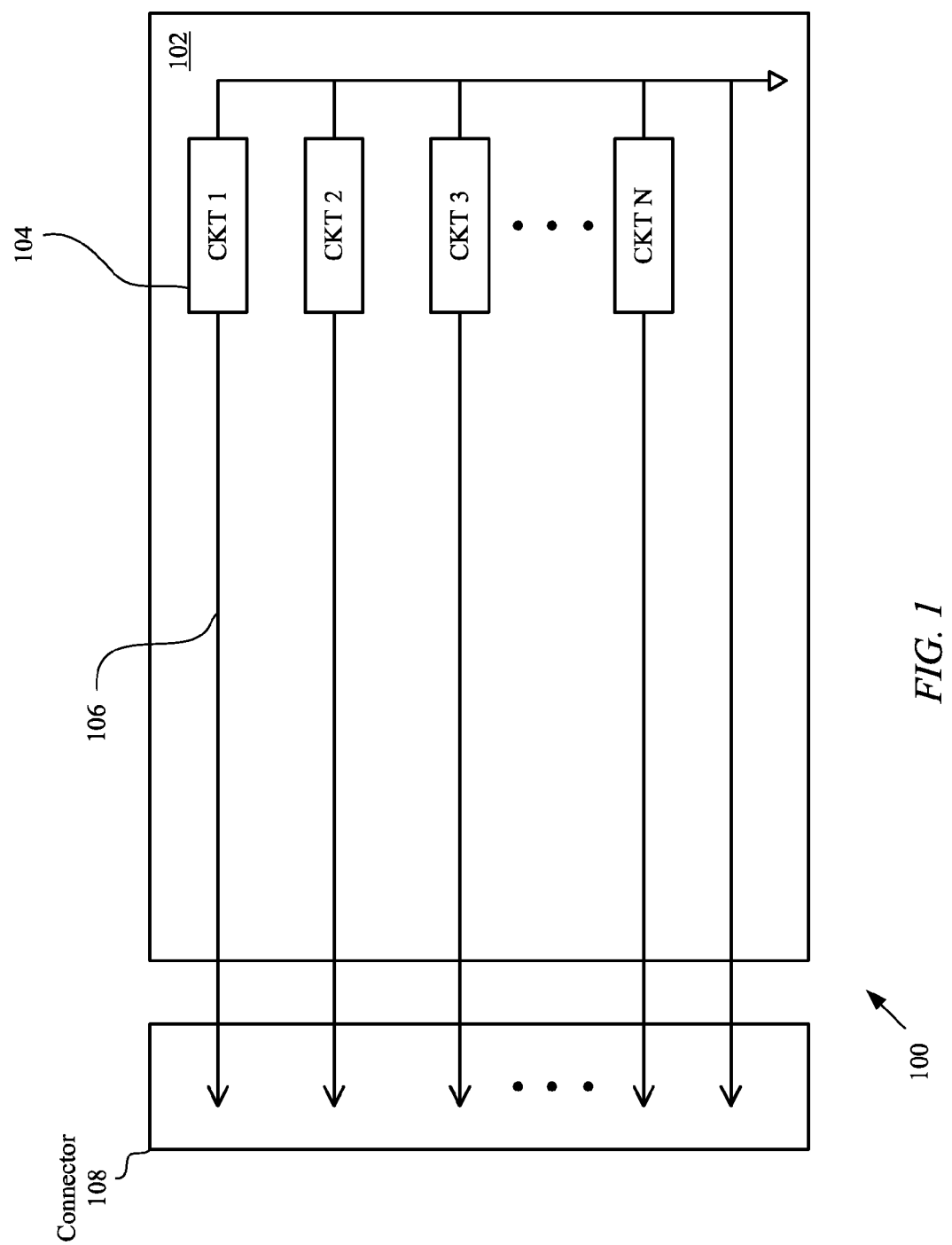
FIG. 1 is a block diagram of a printed circuit assembly.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Electronic components are often disposed on a substrate such as a printed circuit board (PCB), flex circuit, touch screen or other similar electronic assemblies. In one embodiment a flex circuit or flexible circuit can be made of a plastic substrate such as polyimide having copper traces printed across it, thereby yielding a flexible printed circuit board. Oftentimes, a network, such as a resistor network, can be used to process or modify signals carried on the substrate. For example, a resistor network can be used to dampen signal excursions or can be used to terminate clock and/or data signals. A resistor network can also be used to couple signals together on the substrate. A resistor network can be implemented with discrete resistors; however, discrete components can be bulky and can require additional area on the substrate.

A resistor network realized with resistive film can be used in place of a resistor network constructed from discrete components. In one embodiment, a resistive film resistor network can couple directly to traces on the substrate simplifying assembly. Such a resistive network can be used to balance charge across a series of circuits. By setting an impedance across the network significantly higher than downstream components only a small amount of current is diverted across this network of resistors during normal operations a network of resistors with an impedance substantially greater than downstream components. In this way during routine operations only a small amount of energy can be lost across the resistive pathway. In situations in which a large charge build up occurs the excess charge can bleed off first across parallel circuits and/or off of the parallel circuits through a capacitor designed to absorb and dissipate charge from the series of circuits.

In another embodiment, the resistive film resistor network can be transparent and not occlude the visibly of objects behind the network. In yet another embodiment the resistive film can be adhesively coupled to a coverlay allowing a number of resistive films to be placed in a specific position in a single assembly step. In some embodiments implement this feature the resistive film and coverlay can be subsequently removed after it is no longer required. For example, in one particular embodiment a set of traces may no longer require the resistive pathways once safely embedded in an electronic device. In such a case removal of the resistive network can be done just prior to or subsequent to placement inside an electronic housing.

These and other embodiments related to placement of a network of resistors with conductive film are discussed below with reference to FIGS. 1-9; however, those skilled in the art will readily appreciate that the detailed description given herein with respect to these figures is for explanatory purposes only and should not be construed as limiting.

FIG. 1 is a block diagram of a printed circuit assembly (PCA) 100. The PCA can include PCB 102 and connector 108. Disposed on PCB 102 are circuit groups 104. The number of circuit groups can vary by implementation. This embodiment includes N circuit groups. Signals from circuit groups 104 can be coupled to connector 108 through traces 106. In one embodiment some circuit groups 104 may not transmit a signal to connector 108. In another embodiment, circuit groups 104 can be identical. In another embodiment, circuit groups 104 can be different. PCB 102 can be implemented as a traditional printed circuit board manufactured from a fiberglass substrate such as FR-4. In other embodiments, PCB 102 can be a flex circuit, semi rigid circuit, or any other technically feasible substrate. Still other embodiments, PCB 102 can be formed from a display. Traces 106 can be formed from copper, aluminum, doped semiconductor material or any other technically feasible conductive material.

In some embodiments of PCA 100, circuit groups 104 can exhibit a characteristic where it may be beneficial to couple two or more signals (via traces 106) of circuit groups 104 together through a resistive pathway. For example, if a voltage builds up within one or more of the circuit groups 104, a resistive pathway can offer a discharge pathway for the voltage. Further, if the resistive pathway is carefully designed, then operation of the circuit groups 104 may not be adversely effected. Voltage build up within circuit groups 104 can exist due to a lumped or distributed capacitance within circuit groups 104. This capacitance can be modeled as a single capacitor appearing between two ports of circuit group 104.

Figure 2:
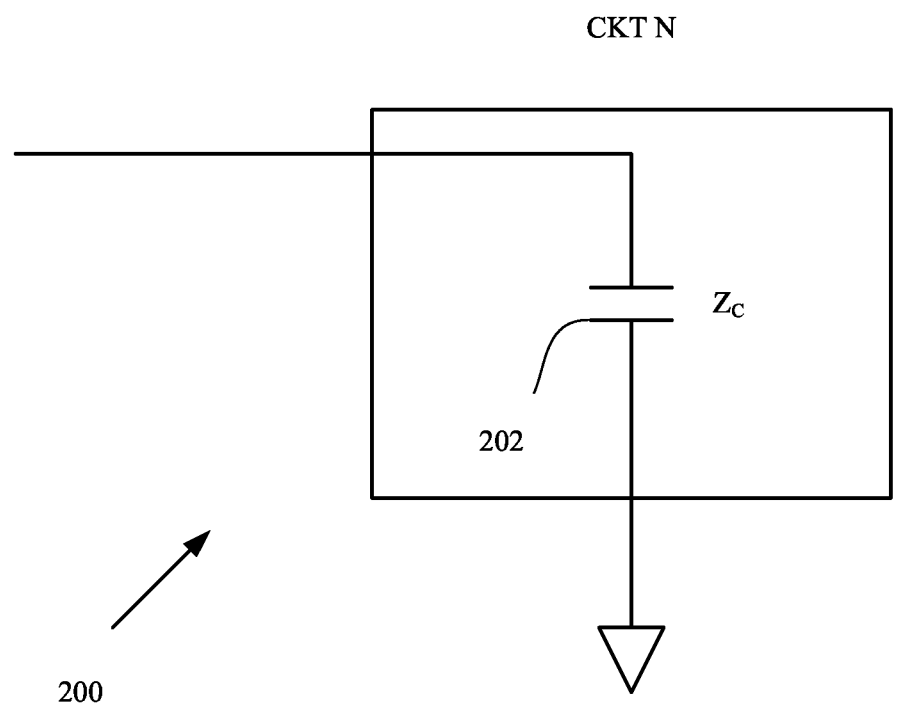
FIG. 2 is a block diagram showing a capacitive model of a circuit group.

FIG. 2 is a block diagram showing a capacitive model 200 of circuit group 104. Although the exact circuitry inside circuit group 104 can be quite complex, a simplified representation can be constructed. In this embodiment, one or more internal capacitances within circuit group 104 can be lumped together as a single capacitance shown in FIG. 2 as $Z_C$ 202. Although a capacitive model 200 is shown here, other models are possible. For example, a resistive or inductive model can be developed for circuit group 104. Circuit models do not need to be monolithic (limited to only one aspect, such as capacitive). Other possible models can include two or more aspects. For example, another embodiment of a model of circuit group 104 can include both resistive and capacitive aspects.

Figure 3:
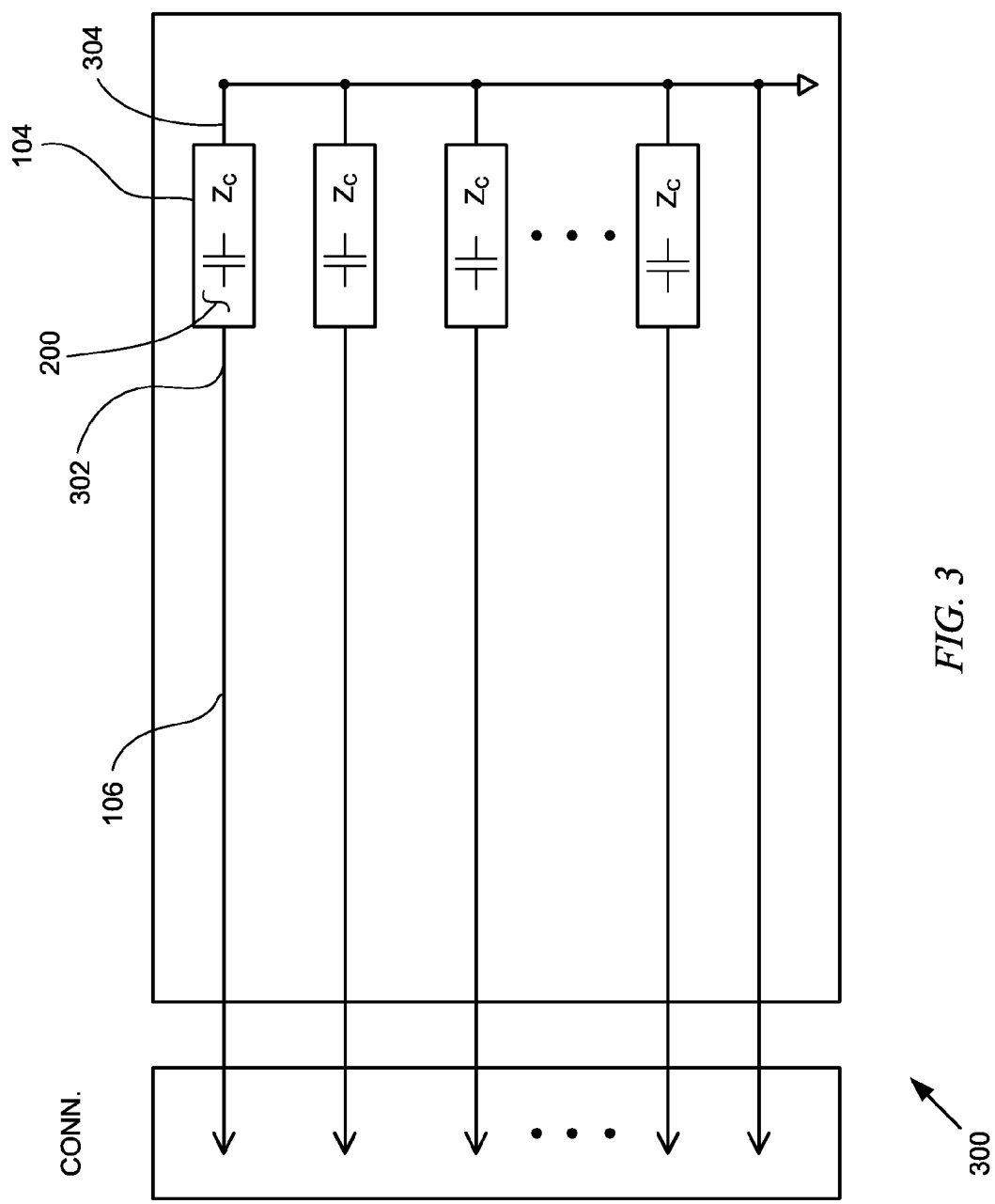
FIG. 3 is a block diagram of a PCA system showing a capacitive model within circuit groups.

Replacing circuit groups 104 with capacitive model 200 can help illustrate the voltage storage problem described in conjunction with FIG. 1. FIG. 3 is a block diagram of PCA system 300 showing capacitive model 200 within circuit groups 104. Capacitor $Z_C$ can have a first terminal 302 and a second terminal 304. A voltage can build up on terminal 302. Many capacitors can have high internal impedance as seen between capacitor terminals 302 and 304. In one embodiment, the internal impedance can be one Tera-ohm ($1 \times 10^{12}$ ohms). Thus, in the embodiment shown in FIG. 3, if a charge builds up on terminal 302, the charge cannot easily dissipate to terminal 304 to ground since the charge flow is impeded by the high internal impedance of $Z_C$. A discharge path can provided for voltage built up within circuit groups 104. In one embodiment a resistance pathway can be provided coupling two or more terminals of circuit groups 104. One embodiment can leverage traces 106 to couple circuit groups 104.

Figure 4:
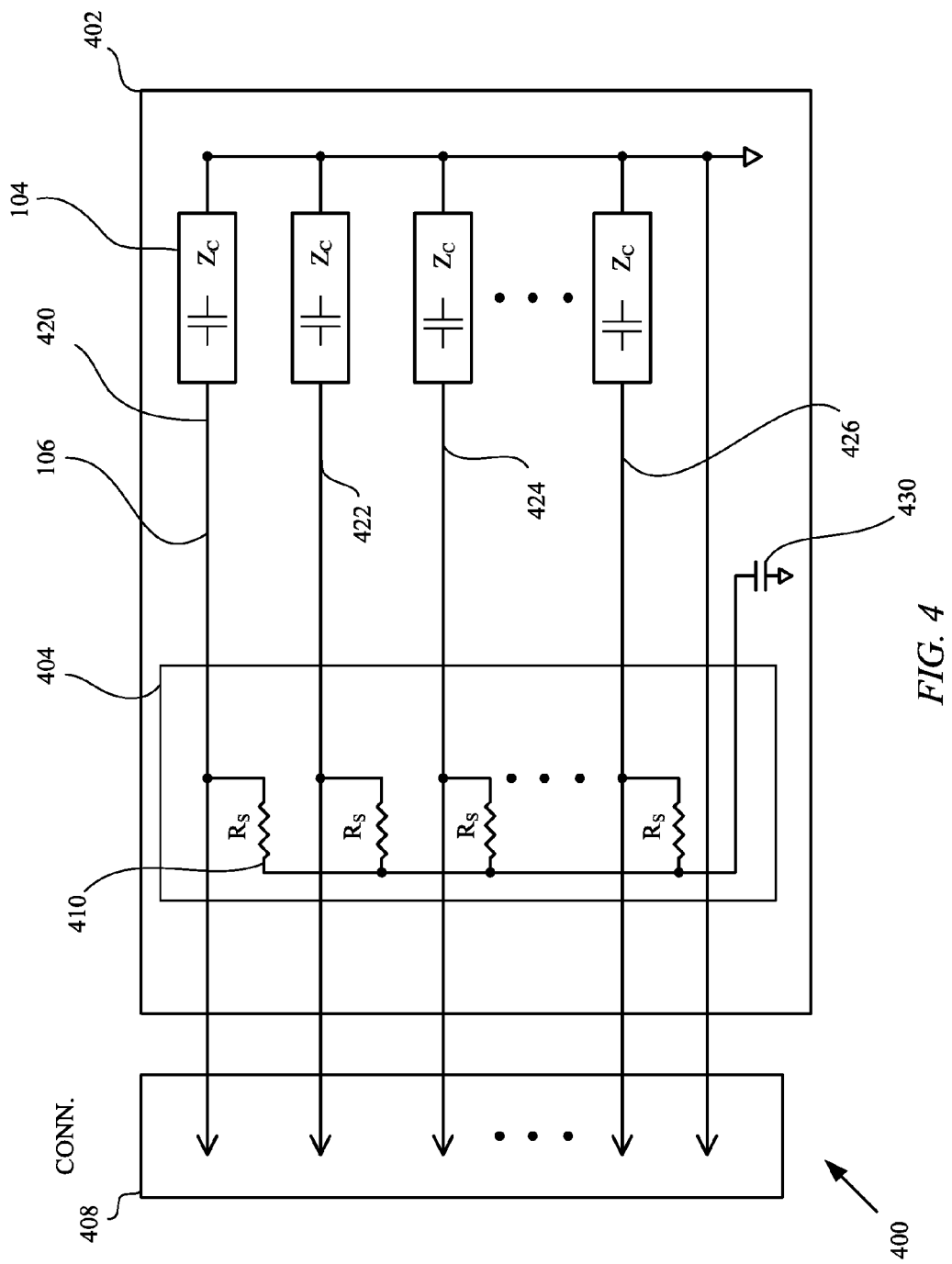
FIG. 4 is a block diagram of one embodiment of a PCA system.

FIG. 4 is a block diagram of one embodiment of PCA system 400. PCA system 400 can include PCB 402, connector 408, circuit groups 104 and resistor network 404. Resistor network 404 can include resistive elements 410 distributed within resistor network 404. Each resistive element 410 can have a characteristic resistance $R_S$. In one embodiment, resistive elements 410 can have relatively identical resistances. In another embodiment, resistive elements 410 can have relatively different resistances. Resistor network 404 can couple traces 106 together as shown through resistive elements 410.

In one embodiment, the resistor network 404 can advantageously allow a voltage stored in one or more circuit groups 104 to be dissipated to other circuit groups 104 through resistive elements 410. For example, if a voltage appears on node 420, the voltage can be dissipated through resistor network 404 to nodes 422, 424 and 426. In another embodiment, resistor network 404 can couple signals from traces 106, through resistive elements 410 to capacitor 430. Capacitor 430 can provide relatively more capacity for storing and dissipating a voltage relative to capacitors $Z_C$. For example in cases where after the voltage at node 420 has been balanced across nodes 422, 424, and 426, capacitor 430 can receive and dissipate excess voltage distributed across the aforementioned nodes. In some embodiments capacitor 430 can be coupled directly to resistor network 404, while in other embodiments it can be connected to a conductive adhesive arranged across an upper surface of the resistor network. Although resistor network 404 can be implemented with discrete resistors, such an implementation can be costly in terms of component cost as well as the cost related to the board area needed to support the discrete resistors.

In one embodiment, resistor network 404 can be realized with a transparent resistive film such as indium tin oxide (ITO) film or other technically feasible materials. Transparent resistive film can have a characteristic resistance, often expressed in terms of ohms per square. Thus, by controlling area of the resistive film, resistive elements 410 can be realized. In one embodiment, when resistor network 404 is implemented with resistive film, resistor network 404 can be disposed on PCB 402 such that resistive elements 410 can contact and couple directly to traces 106. This embodiment can eliminate the need for discrete resistors and PCB area needed to support discrete resistors and can advantageously reduce assembly height as resistive films can be thinner than discrete resistors. Although placing additional resistance within circuit diagram 400 can cause a bleed off of energy in the circuit, where components associated with connector 108 have substantially smaller impedance, a flow of current across resistive elements 506 can be quite small, yielding only minor signal loss during normal operations. However, during a voltage spike caused by for example electro static discharge (ESD) during an assembly process a significant amount of charge can build up at node 420. At this point balancing of excess voltage can be extremely important allowing current to pass along each of traces 106 without interruption due to voltage build up on a specific node. Capacitor 430 electrically coupled to resistor network 404 can then be useful for storing and dissipating the excess built up charge.

Figure 5:
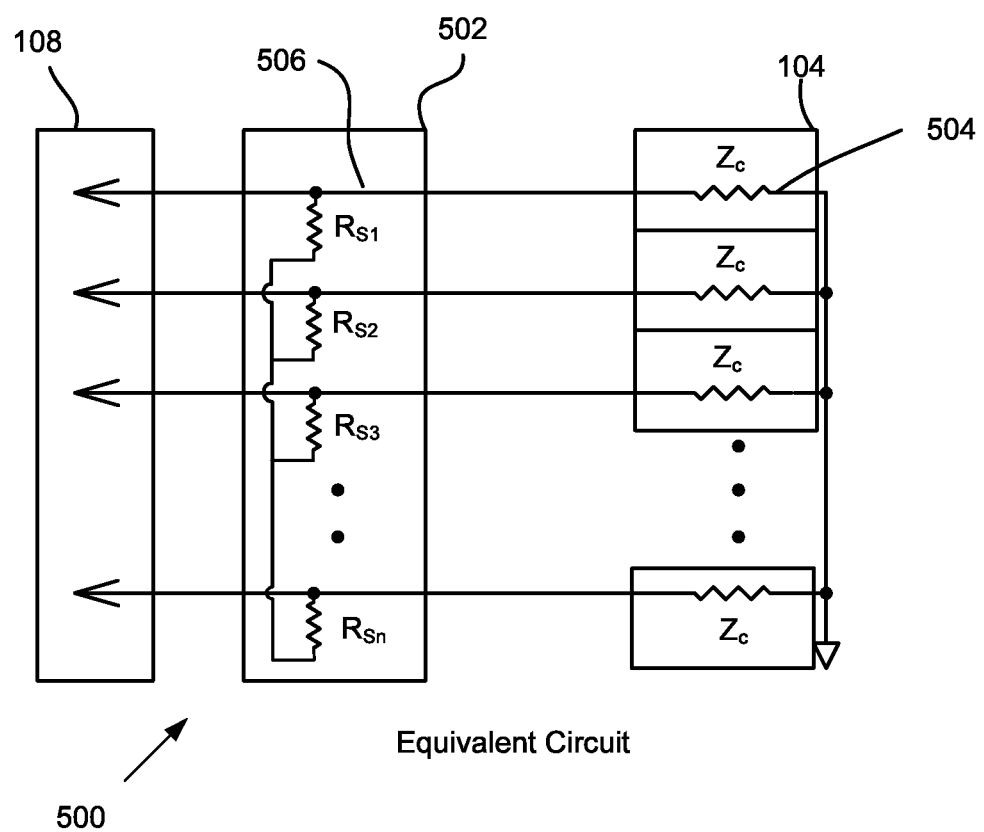
FIG. 5 is an equivalent circuit diagram of one embodiment a PCA.

FIG. 5 is an equivalent circuit diagram 500 of one embodiment PCA 400. Resistor network 502 can include resistive elements 506. Circuit groups 104 can have internal resistance 504. In one embodiment, resistive elements 506 can be configured to effectively allow voltages built up within circuit groups 104 to be dissipated without adversely affecting operation of circuit groups 104. For example, resistive element 506 values can have relatively lower resistance values compared to internal resistance 504 values, but still appear relatively high, especially when viewed from connector 108. In one embodiment, resistive element 506 values can be determined by a ratio to internal resistance 504 values. For example, in one embodiment the ratio of resistive element 506 to internal resistance 504 can be 1:1000. For example, if internal resistance 504 is 1 Tera ohm, then resistive element 506 can be 1 Mega ohm. Other embodiments can use other ratios.

Figure 6:
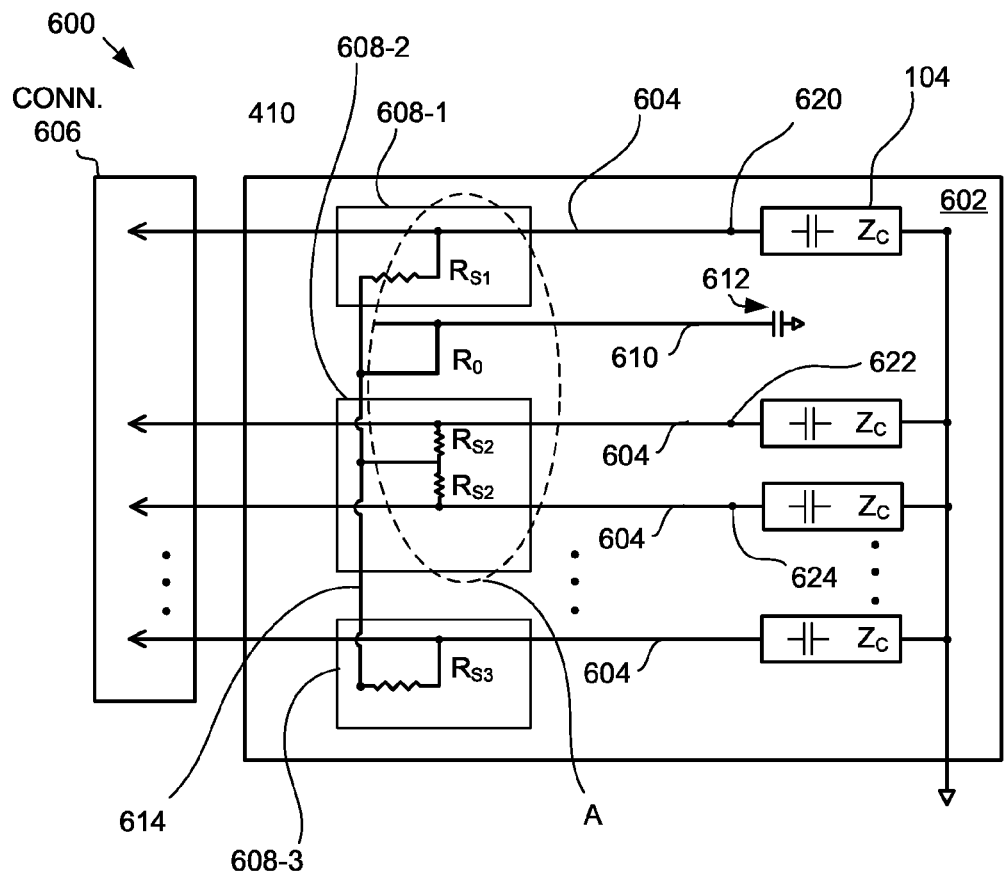
FIG. 6 is a block diagram of another embodiment of a PCA system.

FIG. 6 illustrates another embodiment PCA 600. PCA 600 includes PCB 602 and electrical traces 604, electrical coupling signals moving along traces 604 to connector 606. In this embodiment a series of resistive conductive films 608-1, 608-2 and 608-3 overlay electrical traces 604. Resistive conductive film 608-2 couples two traces together allowing a voltage to be balanced across the two traces. Ground trace 610 is connected to ground and allows signals flowing through conductive films 608-1, 2, and 3 to be distributed to capacitor 612 in cases of charge build up at nodes 620, 622, or 624. Ground trace 610 can be electrically coupled to traces 604 by way of a conductive adhesive, as will be illustrated more clearly below in FIG. 7. An electrical path 614 associated with the conductive adhesive facilitates charge to be transferred from conductive films 608-1, 2, and 3 to ground trace 610, thereby allowing bleed of excess current to capacitor 612. The amount of charge held within each of traces 604 can be configured by manipulating resistance of conductive films 608 and resistivity of the conductive adhesive. It should be noted that in some embodiments traces 604 can be have larger and smaller associated impedance. Furthermore, circuit groups 104 can also have varying impedance, this can in part be manipulated and normalized by changing resistivity of conductive films 608. Furthermore, while electrical path 614 is shown without an electrical resistance it does have its own electrical resistance based upon the type and mixture of conductive adhesive associated with it.

Figure 7:
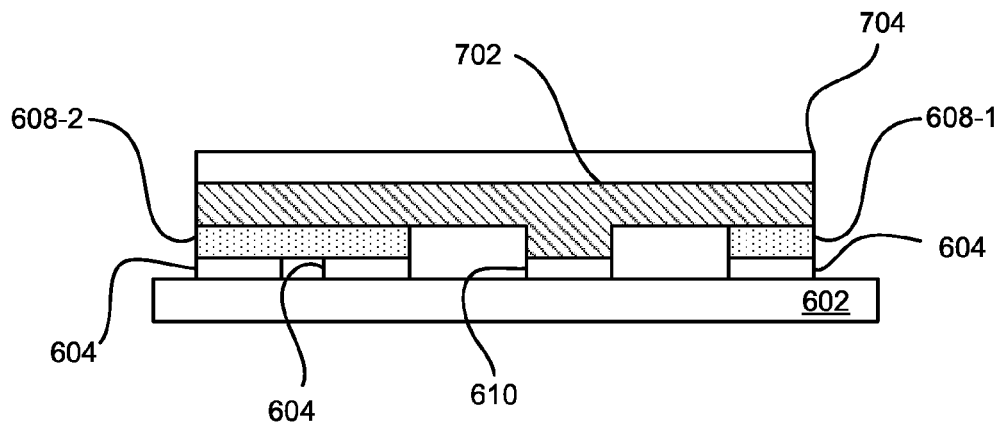
FIG. 7 is a cross sectional view of another embodiment of a PCA in accordance with the specification.

FIG. 7 is a cross sectional view of PCA 600 similar in configuration to portion A from FIG. 6. PCA 600 can include traces 604 and ground trace 610 disposed on a substrate 602. The substrate can be a PCB, flex circuit, semi-rigid circuit or other technically feasible substrate. Traces 604 can be copper, doped semiconductor or other similar conductive materials. Resistive film 608-1, and 608-2 can be disposed on traces 604. Conductive adhesive 702 can be disposed on resistive films 608-1, 608-2 and directly to ground trace 610. In one embodiment, conductive adhesive 702 can couple traces 604 through resistive film 608. As shown, conductive adhesive 702 can also be disposed directly on ground trace 610. Ground trace 610 as illustrated above can include a capacitor configured to store and dissipate excess charge from the PCA. In this way, conductive adhesive 608 can directly couple to ground trace 610 and offer a relatively lower resistive pathway compared to resistive film 606. In one embodiment, coverlay 704, conductive adhesive 702 and resistive film 606 can be formed together as a unit. In this way, coverlay 704 can ease the assembly and installation of conductive adhesive 702 and resistive film 608 onto traces 604 and 610 by allowing simultaneous installation of all three in a single operation. In one embodiment, coverlay 704, conductive adhesive 702 and resistive film 606 can be relatively clear and can be positioned onto substrates that are visible to the user such as screens, keyboards or displays. In yet another embodiment, established resistive pathways can be most useful during a manufacturing process where components are less securely grounded and more susceptible to stray voltages and/or environmental disturbances. In such a case coverlay 704 and its associated conductive adhesive 702, and resistive film 608 can be removed prior to a final assembly step. In this way any inefficiencies related to the resistive pathways can be removed once the component is securely installed within a device housing. Coverlay 704 can make this more convenient when configured with enough strength to remove adhesive and resistive film from the PCA in a single step.

Figure 8A:
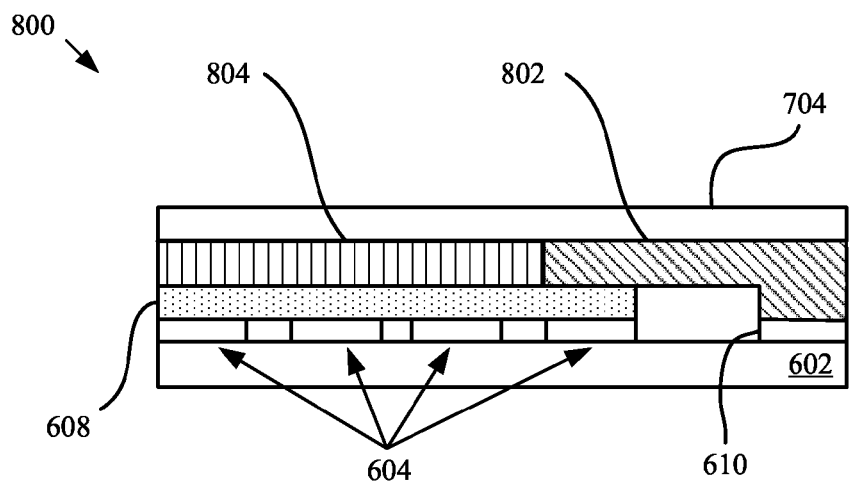
FIG. 8A is a cross sectional view of another embodiment of a PCA having a number of conductive adhesive types.
Figure 8B:
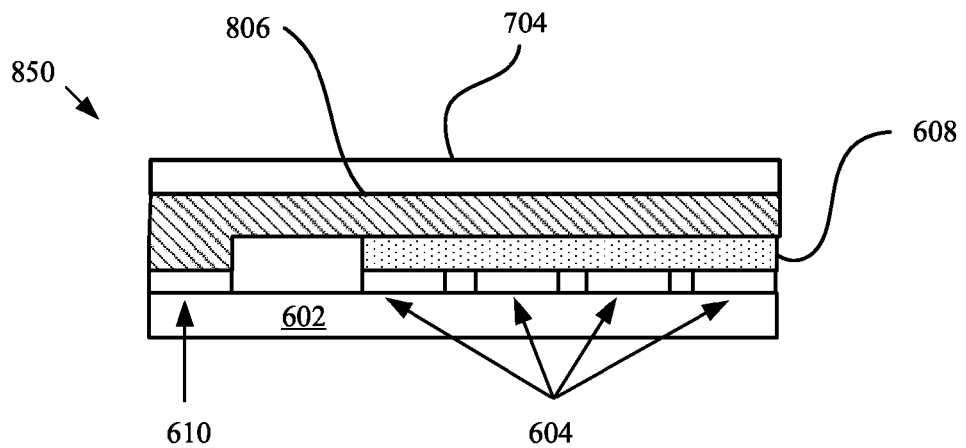
FIG. 8B is a cross sectional view of another embodiment of a PCA in accordance with the specification.

FIG. 8A is a cross-sectional view of PCA 800. In this view impacts of conductive adhesive choice is discussed. In some embodiments if conductive adhesive 802 and conductive adhesive 804 have an associated low enough resistance to current flow instead of seeing current balanced across each of traces 604, current can flow to ground trace 602. In embodiments where conductive adhesive 802 is conductive and conductive adhesive 804 is non-conductive or only slightly conductive, charge can accumulate over each of traces 604 prior to being routed to ground trace 602 via conductive adhesive 802. In FIG. 8B a cross-sectional view of PCA 850 is shown. In this view a uniform conductive adhesive 806 is shown connecting resistive film 608 to ground trace 610. In this embodiment traces 604 can balance charge across resistive film 608 until a charge across each of traces 604 is great enough where flow across conductive adhesive 806 is easier than flow across resistive film 608. In embodiments where conductive adhesive 608 is highly conductive this can be earlier than in embodiments where conductive adhesive 608 has low conductivity.

Figure 9:
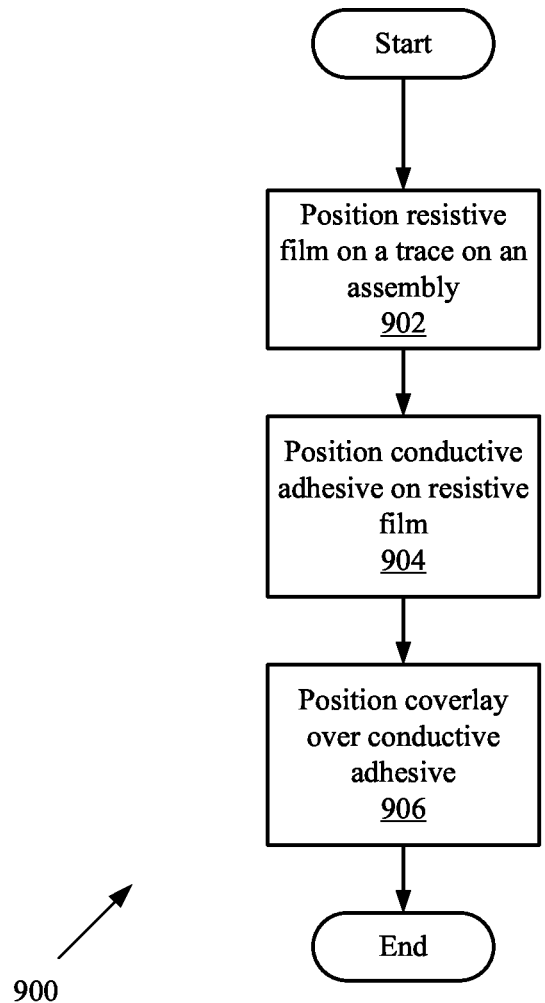
FIG. 9 is a flow chart of method steps for forming a resistive pathway.

FIG. 9 is a flow chart of a method 900 for forming a resistive pathway. Persons skilled in the art will understand that any system configured to perform the method steps in any order is within the scope of this description. The method begins in step 902 where a resistive film is positioned on at least one trace on an electronic assembly. In one embodiment, the resistive film is position so that signals from a number of traces are coupled to the resistive film. In step 904, a conductive adhesive is placed upon the resistive film thereby electrically coupling the conductive adhesive to the resistive film. Thus signals from traces 604 are coupled through resistive film 606 to conductive adhesive 608 and form a resistive pathway. In step 806 a coverlay 610 is positioned over the conductive adhesive. The coverlay 610 can protect not only conductive adhesive 608 and resistive film 606, but also substrate 602.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device, comprising:
    a printed circuit board;
    a plurality of electrical traces disposed on the printed circuit board, a first end of each of the plurality of electrical traces coupled to a high impedance circuit;
    a resistive film disposed across the plurality of electrical traces, the resistive film having an impedance substantially less than any one of the high impedance circuits;
    a layer of conductive adhesive; and
    a layer of coverlay adhesively joined to the resistive film by the layer of conductive adhesive,
    wherein a second end of each of the plurality of electrical traces is electrically coupled to a low impedance circuit having a substantially lower impedance than the resistive film.

2. The electronic device as recited in claim 1, further comprising:
    a capacitor electrically coupled to the resistive film,
    wherein the capacitor can absorb and dissipate charge built up on the plurality of traces.

3. The electronic device as recited in claim 1, further comprising:
    a capacitor electrically coupled to the conductive adhesive,
    wherein the capacitor can absorb and dissipate charge built up on the plurality of traces.

4. The electronic device as recited in claim 3, wherein the layer of conductive adhesive comprises:
    a first conductive adhesive; and
    a second conductive adhesive having a greater impedance than the first conductive adhesive,
    wherein the second conductive adhesive is disposed along at least half of the resistive film, and the first conductive adhesive covers the remaining portion of the resistive film.

5. The electronic device as recited in claim 4, wherein the printed circuit board is a flexible printed circuit board.

6. The electronic device as recited in claim 5, wherein the flexible printed circuit board comprises a polyimide substrate.

7. The electronic device as recited in claim 2, wherein the low impedance circuits have an impedance 100 times less than impedance of the resistive film.

8. The electronic device as recited in claim 7, further comprising:
    an electrical connector electrically coupled to the second end of the plurality of electrical traces, each second end electrically coupled to a low impedance circuit,
    wherein the low impedance of the low impedance circuits allows only a small amount of current to pass along the resistive film during normal operation of the electronic device.

9. The electronic device as recited in claim 1, wherein the resistive film is in direct contact with the plurality of electrical traces.

10. The electronic device as recited in claim 1, wherein the resistive film electrically couples the plurality of traces in parallel such that built up charge on any of the plurality of traces is distributed across the plurality of traces.

11. The electronic device as recited in 1, wherein the layer of coverlay, the layer of conductive adhesive and the resistive film are formed together as a single unit with respect to the printed circuit board.

12. The electronic device as recited in claim 11, wherein the single unit is configured to be removed from the printed circuit board, wherein removal of the single unit removes an electrical pathway between the plurality of electrical traces.

13. The electronic device as recited in claim 1, further comprising another resistive film disposed on another electrical trace, the other resistive film coupled to the layer of conductive adhesive.

14. The electronic device as recited in 13, wherein the resistive film, the other resistive film and the layer of conductive adhesive electrically connect the other electrical trace and the plurality of electrical traces in parallel.

15. The electronic device as recited in 13, wherein the resistivity of the other resistive film and the resistivity of the resistive film are different.

16. The electronic device as recited in claim 1, wherein the resistivity of the resistive film is greater than the resistivity of the layer of conductive adhesive.

17. The electronic device as recited in 16, wherein the layer of conductive adhesive is electrically coupled to a ground trace.

18. The electronic device as recited in claim 1, wherein each of the high impedance circuits are disposed on the printed circuit board.

* * * * *

UNITED STATES PATENT AND TRADEMARK OFFICE
CERTIFICATE OF CORRECTION

PATENT NO. : 8,687,369 B2  
APPLICATION NO. : 13/629542  
DATED : April 1, 2014  
INVENTOR(S) : David A. Stronks et al.

It is certified that error appears in the above-identified patent and that said Letters Patent is hereby corrected as shown below:

In the Claims

Column 8, line 28, Claim 11, replace the following text "as recited in 1" with "as recited in claim 1".

Column 8, line 36, Claim 13, replace the following text "as recited in 1" with "as recited in claim 1".

Column 8, line 40, Claim 14, replace the following text "as recited in 13" with "as recited in claim 13".

Column 8, line 44, Claim 15, replace the following text "as recited in 13" with "as recited in claim 13".

Column 8, line 47, Claim 16, replace the following text "as recited in 1" with "as recited in claim 1".

Column 8, line 50, Claim 17, replace the following text "as recited in 16" with "as recited in claim 16".

Column 8, line 53, Claim 18, replace the following text "as recited in 1" with "as recited in claim 1".

Signed and Sealed this  
Eighth Day of July, 2014

Michelle K. Lee  
*Deputy Director of the United States Patent and Trademark Office*